United States Patent [19]

Matthys

[11] Patent Number: 4,562,526
[45] Date of Patent: Dec. 31, 1985

[54] VOLTAGE CONTROL CIRCUIT

[75] Inventor: Robert J. Matthys, Minneapolis, Minn.

[73] Assignee: Honeywell Inc., Minneapolis, Minn.

[21] Appl. No.: 671,795

[22] Filed: Nov. 14, 1984

Related U.S. Application Data

[63] Continuation of Ser. No. 394,227, Jul. 1, 1982, abandoned.

[51] Int. Cl.[4] ............................................. H02M 7/19
[52] U.S. Cl. ...................................... 363/61; 315/205
[58] Field of Search ............................ 363/59, 60, 61; 307/109, 110; 315/205, 227 R, 240

[56] References Cited

U.S. PATENT DOCUMENTS

| | | | |
|---|---|---|---|
| 3,422,308 | 1/1969 | Sullivan . | |
| 3,450,972 | 1/1969 | Linkroum . | |
| 3,526,821 | 9/1970 | Thomas | 363/61 |
| 3,735,238 | 5/1973 | Miller . | |
| 3,878,450 | 4/1975 | Greatbatch | 363/60 |
| 4,201,949 | 5/1980 | Robbins . | |
| 4,209,730 | 6/1980 | Pasik | 315/205 |
| 4,363,088 | 12/1982 | Yamamoto et al. | 363/59 |

FOREIGN PATENT DOCUMENTS

| | | |
|---|---|---|
| 1116316 | 5/1962 | Fed. Rep. of Germany . |
| 1580879 | 3/1968 | France . |

OTHER PUBLICATIONS

Berezovskii, A. F., "Voltage Doubler for Rectifier", *Soviet Inventions Illustrated Week*, Jun. 3, 1981, sec. u-24.

M. C. Richardson et al., "A 300-J Multigigawatt $CO_2$ Laser", IEEE Journal of Quantum Electronics, vol. QE-9, No. 2, Feb. 1973, pp. 236-243, see Figure 2.

*Primary Examiner*—Peter S. Wong
*Assistant Examiner*—Anita M. Ault
*Attorney, Agent, or Firm*—William T. Udseth

[57] ABSTRACT

An electrical control circuit includes a first energy storage means adapted to store electrical energy in response to a potential source of a first polarity relative to a reference point in said circuit, thereby providing a first voltage of a first magnitude; a second energy storage means adapted to store electrical energy, without affecting said first energy storage means, in response to a potential source of a second polarity relative to said reference point, thereby providing a second voltage of a second magnitude; and means for electrically connecting said first and second energy storage means so as to provide an output voltage related to the sum of said first and second magnitudes. Four embodiments are presented with two embodiments arranged so that substantial voltage is supplied to a load only when said first and second energy storage means are connected by an electrical connecting means.

32 Claims, 5 Drawing Figures

VOLTAGE CONTROL CIRCUIT

This application is a continuation of application Ser. No. 394,227 filed July 1, 1982 now abandoned.

BACKGROUND OF THE INVENTION

1. Field of the Invention

This invention relates to voltage control circuits. Particularly disclosed herein are voltage doubler circuits for use with gas lasers and, more particularly, for use with transversely excited atmospheric pressure (TEA) lasers.

2. Prior Art

Many voltage control circuits, including voltage doublers, have been disclosed in the past. Such circuits have been designed to use either DC or AC power supplies and, in the AC supply case, charge energy storage elements (e.g. capacitors) during only one-half cycle or the full cycle.

However, a simple high voltage multiplier circuit, and particularly a doubler, which can be easily adapted to supply substantial DC voltage to a load only when switched on has not heretofore been disclosed. The present invention affords the characteristics listed immediately above and is particularly useful in supplying gas laser discharge voltages.

A popular prior art voltage doubler for gas lasers is shown in FIG. 1, i.e. the Marx generator. In Marx generator 10 the DC supply $KVDC_{IN}$ charges capacitors 12 and 14 (which have the same capacitance), with the same polarity, as shown. After capacitors 12 and 14 are fully charged, when spark gap 16 fires, capacitors 12 and 14 are momentarily placed in series thus applying the full voltage stored in capacitors 12 and 14 to the load, a TEA laser. Since two capacitors 12 and 14 are provided, twice the voltage which can be stored on either capacitor is applied to the TEA laser.

However, prior to firing spark gap 16, when capacitor 14 is fully charged, the full input voltage $KVDC_{IN}$ which is equal to one-half of device 10's output voltage is applied to the TEA laser. Generally the maximum output voltage of device 10 is just sufficient to discharge the TEA laser. In that case, one-half the output voltage is approximately one-half the laser discharge voltage. Application of one-half the laser discharge voltage to the TEA laser prior to the seleced firing of the laser leads to undesirable corona and gas discharge effects inside the laser. Spark gap 16 must withstand one-half the full laser discharge voltage in Marx generator 10 for proper operation.

The Marx generator multiplies an output voltage and its spark gap must withstand half the output voltage, but it supplies one-half the full DC output voltage to the laser prior to pulsing the laser with the full output voltage. Further, in the Marx generator, no ground connection is made directly to the spark gap. Such a connection is desirable in high voltage applications.

SUMMARY OF THE INVENTION

An electrical circuit is provided which includes a first energy storage means adapted to store electrical energy in response to a potential source of a first polarity relative to a reference point in said circuit, thereby providing a first voltage of a first magnitude, a second energy storage means adapted to store electrical energy, without affecting said first energy storage means, in response to a potential source of a second polarity relative to said reference point, thereby providing a second voltage of a second magnitude, and means for electrically connecting said first and second energy storage means so as to provide an output voltage related to the sum of said first and second magnitudes.

The above described circuit can be adapted to supply substantial DC voltage to a load only upon electrically connecting said electrical energy storage means in series by connecting said electrical connection means (opened) between the positive charging pole of said first electrical energy storage means and the negative charging pole of said second electrical energy storage means, connecting said load between the negative charging pole of said first electrical energy storage means and the positive charging pole of said second electrical energy storage means and charging said first and second energy storage means in parallel. When said electrical connection means is closed, said first and second energy storage means will be connected in series with the same polarity and apply a voltage related to the sum of said corresponding first and second voltages to said load. First and second embodiments of the above circuit are disclosed, one which utilizes an AC source and the other which utilizes a DC source.

Third and fourth embodiments are provided which do apply substantial voltages to a load prior to electrically connecting first and second electrical energy storage means in series, but provide a common ground or reference point between a means for connecting said storage means in series and a load. This is particularly desirable in high voltage, voltage multiplier circuit applications.

DESCRIPTION OF THE PREFERRED EMBODIMENTS

Figure 1:
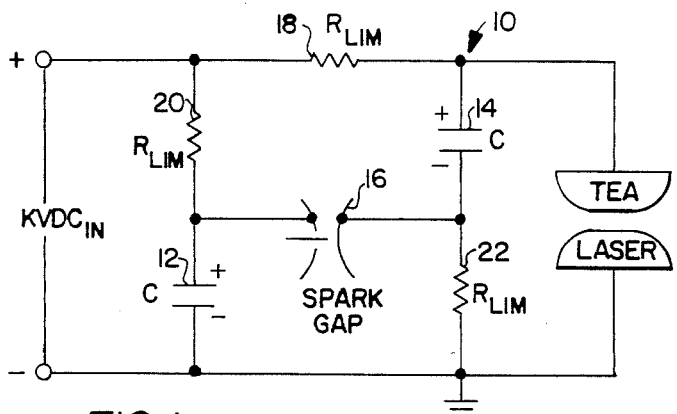
FIG. 1 is an electrical schematic of a prior art circuit.
Figure 2:
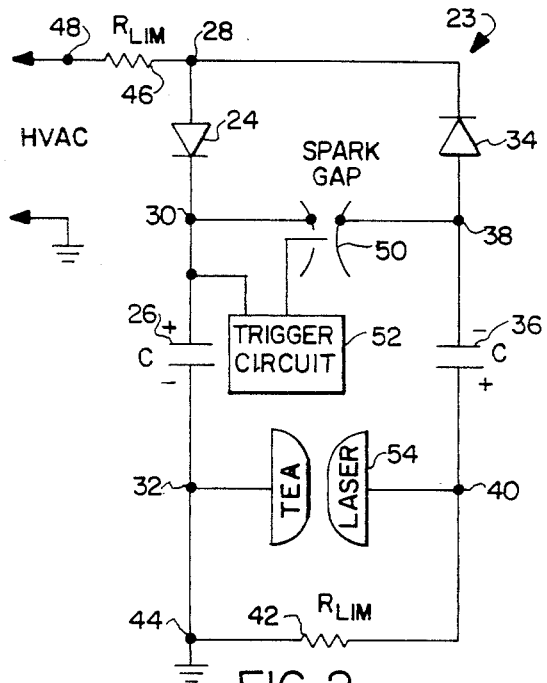
FIG. 2 is an electrical schematic of the first embodiment of the present invention.

The first embodiment (circuit 23) in FIG. 2 includes diode 24 (i.e. a first unidirectional current conducting means) connected in series with capacitor 26 (i.e. a first capacitor means, a capacitor means alone or in conjunction with a diode comprise a means for storing electrical energy). Note that "connected" will mean "electrically connected" unless otherwise indicated. Diode 24 is connected between nodes 28 and 30 (i.e. first and second terminating regions) and capacitor 26 is connected between node 30 and node 32 (i.e. a third terminating regions).

Similarly, diode 34 (i.e. a second unidirectional current conducting means) is electrically connected in series with capacitor 36 (i.e. a second capacitor means). Diode 34 is connected between node 28 and node 38 (i.e. a fourth terminating region). Capacitor 36 is connected between node 38 and node 40 (i.e. a fifth terminating region).

Current limiting resistor 42 (i.e. a first resistance means) is connected between node 40 and node 44. Node 44 is depicted as ground in FIG. 2, however, if an AC source is electrically connected between being nodes 28 and 44, node 44 will alternate between being an input node and a reference node during each cycle. Current limiting resistor 46 is connected between node 28 and node 48. Again, node 48 serves as an input node or a reference node if an AC source is connected thereto.

Spark gap 50 (i.e. means for electrically connecting capacitor 26 and 36) is connected between node 30 and 38. Spark gap 50 can be of various configurations depending on the intended use of circuit 23. If circuit 23 will be employed to produce an output voltage for a gas laser, circuit 23 will likely be designed as a voltage doubler. Spark gap 50, however, must withstand the full voltage output of circuit 23 when spark gap 50 is open. A trigger circuit 52 is employed to trigger the firing of spark gap 50 at selected times. Trigger circuit 52 often includes a step up transformer, is capacitively isolated from high voltage DC sources and incorporates a bleeder resistor between a charging line and an electrode of the spark gap to reduce the chances of unwanted firing of the spark gap. Spark gaps are preferable to semiconductor switches when circuit 23 is used with gas lasers because the production of laser discharge voltages requires high voltages (e.g. 25K to 125K volts) as well as fast switching. The voltages required for gas lasers are roughly an order of magnitude higher than semiconductor switches can handle.

TEA laser 54 is a load to which the output of circuit 23 is applied. TEA laser 54 is connected between nodes 32 and 40. TEA lasers are designed to deliver high peak power outputs. The ability to pulse such lasers with the laser discharge voltage when desired and to not apply a voltage to the laser electrodes during non-fire times are desirable characteristics of a gas laser discharge voltage circuit. If during non-fire times as much as one-half the full laser discharge voltage is applied across a gas laser, undesirable corona effects and ionization can occur. These undesirable effects can degrade the gas, shorten the useful life of the gas, and even cause the ionization to spread through the gas and lead to an actual laser discharge.

In operation, circuit 23 is supplied by a high voltage AC source (HVAC) applied between nodes 44 and 48. During positive half cycles (i.e. node 48 is the plus terminal), diode 24 passes current from node 48 to node 44 charging capacitor 26 with the polarity shown. Diode 34 allows only negligible, reverse bias current to flow to capacitor 36 during positive half cycles. During negative half cycles (i.e. node 44 is the plus terminal) diode 34 passes current from node 44 to node 48 charging capacitor 36 with the polarity shown. Diode 24 allows only negligible reverse bias current to flow to capacitor 26 during negative half cycles.

Each side or branch of circuit 23 (i.e. a first branch between nodes 28 and 44 including diode 24 and capacitor 26, and a second branch between node 28 and 44 including diode 34 and capacitor 36) charges as a separator RC network. A typical value of capacitance for capacitors 24 and 34 is 0.15 μfd and of resistance for resistors 42 and 46 is 10K ohms. (Note that in describing circuit 23 in terms of branches, nodes 30, 38, 28 and 44 could be described as first, second, third and fourth common nodes, respectively and node 32 and 40 could be described as first and second terminating regions, respectively.)

After a few time constants then, capacitors 26 and 36 will be fully charged. Furthermore, during the charging of capacitors 26 and 36, only a small, transient current will appear in resistor 42 thus producing an insubstantial voltage drop (relative to the voltage required to produce the above described undesirable effects in gas lasers) across resistor 42, and consequently across TEA laser 54. Once capacitors 26 and 34 are fully charged, no voltage drop will appear across resistor 42 (because no current will be flowing through resistor 42) and thus no voltage will be applied to TEA laser 54.

The capacitance and resistance valves of capacitors 26 and 36 and resistors 42 and 46 can be adjusted to vary the time constants of said first and second branches as well as the maximum voltage appearing across TEA laser 54 (or a load) during the charging of capacitors 26 and 36.

When capacitors 26 and 36 are fully charged, trigger circuit 52 can be activated firing (i.e. closing) spark gap 50. This in turn momentarily connects capacitors 26 and 36 in series with spark gap 50 and TEA laser 54. Thus, since the polarities of charged capacitors 26 and 36 are such that the voltages corresponding to charged capacitors 26 and 36 will add, assuming insubstantial voltage drops across spark gap 50 and in the remainder of this series connection, the output voltage applied to TEA laser 54 will equal the sum of the corresponding voltages on capacitors 26 and 36. TEA laser 54 has been chosen to fire upon application of such an output voltage, therefore TEA laser 54 will fire only when spark gap 50 is fired.

Furthermore, since only an insubstantial voltage drop will occur across TEA laser 54 prior to the closing of spark drop 50, said undesirable corona and ionization will not occur in TEA laser 54. With only capacitors 26 and 36 in circuit 23, a voltage doubler is provided.

A variation of the first embodiment would substitute a third diode (not shown) in place of resistor 42. Said third diode would be connected to pass substantial current only in the same direction as diode 34 (i.e. the P side of a semiconductor diode would be connected to node 44). This variation would offer the advantage of a smaller transient voltage across TEA laser 54 during charging of capacitors 26 and 36.

Figure 3:
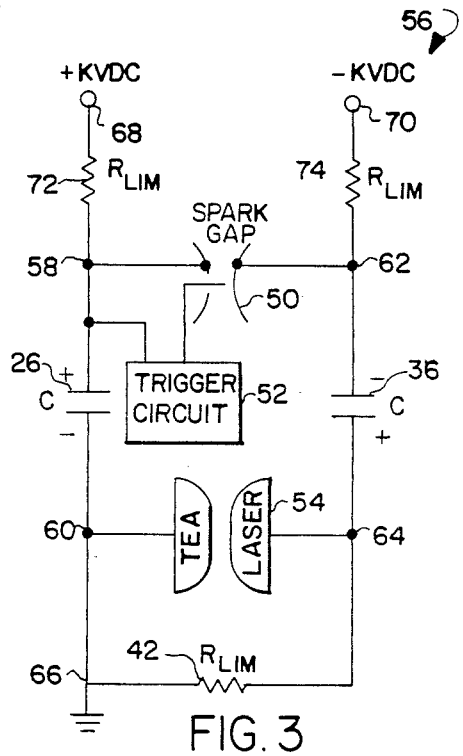
FIG. 3 is an electrical schematic of the second embodiment of the present invention.

FIG. 3 shows the second circuit embodiment 56 of the present invention. Elements corresponding to elements of the first embodiment 23 have been numbered the same for clarity. As FIG. 3 readily shows, the difference in the first and second embodiments lies in the means and manner of charging said first and second circuit branches.

In FIG. 3, supply HVAC is replaced by a high voltage direct current supply (or supplies) for providing +KVDC and −KVDC. In circuit 56 capacitor 26 is connected between node 58 (i.e. a first terminating region) and node 60 (i.e. a second terminating region). Capacitor 36 is connected between node 62 (i.e. a third terminating region) and node 64 (i.e. a fourth terminating region). Resistor 42 is connected between node 64 and node 66 (i.e. a fifth terminating region). Trigger circuit 52 is connected relative to spark gap 50 and capacitors 26 and 36 as it was in circuit 23.

Nodes 68 and 70 serve as input nodes for +KVDC and −KVDC respectively. Current limiting resistors 72 and 74 are connected between nodes 58 and 68, and nodes 62 and 70, respectively.

In operation, circuit 56 fully charges capacitors 26 and 36 in the separate RC branches (i.e. one branch including capacitor 26 and the other capacitor 36). The capacitance and resistance valves are chosen with the same functional characteristics in mind as in circuit 23.

Thus, again, no substantial voltage appears across TEA laser 54 prior to firing spark gap 50. Similarly, resistor 42 can also be replaced by a diode (not shown) adapted to only pass substantial current from node 66 to node 64. In some cases, particularly for high voltage applications, circuit 56 may be desired over circuit 23.

Figure 4:
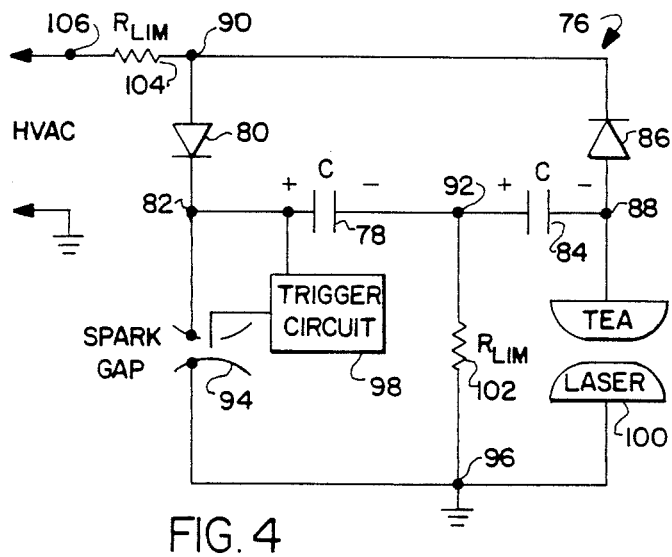
FIG. 4 is an electrical schematic of the third embodiment of the present invention.

The third preferred circuit embodiment 76 of the present invention is shown in FIG. 4. It is not an object of this particular embodiment to apply substantial voltage across the load only when a first and a second electrical storage means are connected in series. Instead, one-half the laser discharge voltage is applied across the laser (or load) as in the Marx generator, however, circuit 76 affords a direct connection between an electrical connecting means (e.g. a spark gap) and a ground point whereas the Marx generator circuit does not.

In FIG. 4, capacitor 78 (i.e. a first capacitor means) is connected in series with diode 80 (i.e. a first unidirectional current conducting means) with node 82 (i.e. a first common terminating region) therebetween. Capacitor 84 (i.e. a second capacitor means) is connected in series with diode 86 (i.e. a second unidirectional current conducting means) with node 88 (i.e. a second common terminating region) therebetween.

Circuit 76 includes two branches, one including capacitor 78 and another including capacitor 84. These branches are connected between nodes 90 and 92 (i.e. third and fourth common terminating regions). Spark gap 94 (i.e. means for electrically connecting capacitors 78 and 84) is connected between node 82 and node 96 (i.e. an output node relative to a load). A load (e.g. a TEA laser 100) is connected between nodes 88 and 96. A trigger circuit 98 is connected to spark gap 94. Current limiting resistors 102 and 104 are connected, respectively, between nodes 92 and 96, and nodes 90 and 106.

When HVAC is applied between nodes 96 and 106 of circuit 76, capacitor 78 will charge through resistor 102 with the polarity shown during the positive half cycle (i.e. node 106 positive). During the negative half cycle, capacitor 84 will charge with the polarity shown. Once capacitors 78 and 84 are charged, trigger circuit 98 is activated, firing spark gap 94 and placing capacitors 78 and 84 in series with spark gap 94 and TEA laser 100.

Since the polarities of charged capacitors 78 and 84 will allow the voltages held across capacitors 78 and 84 to add, the sum of the voltages corresponding to fully charged capacitors 78 and 84 will be applied to TEA laser 100 when spark gap 94 is closed. This of course assumes negligible voltage drops across spark gap 94 and in the connections to TEA laser 100. With only capacitors 78 and 84 in circuit 76, circuit 76 will serve as a voltage doubler.

Figure 5:
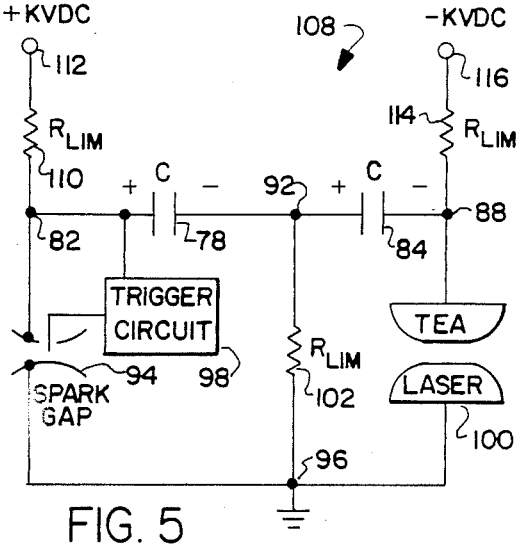
FIG. 5 is an electrical schematic of the fourth embodiment of the present invention.

A fourth and final embodiment, circuit 108, in depicted in FIG. 5. The fourth embodiment substitutes a high voltage DC supply for the AC supply in the third embodiment. Corresponding elements between the third and fourth embodiments are numbered the same for clarity.

Circuit 108 substitutes separated plus and minus high voltages DC sources (i.e. +KVDC and −KVDC) for HVAC in circuit 76. Current limiting resistor 110 is connected between the +KVDC input terminal 112 and node 82. Current limiting resistor 114 is connected between the −KVDC input terminal 116 and node 88. Capacitors 78 and 84 are charged by +KVDC and −KVDC, respectively, with the polarity shown. Thereafter circuit 108 operates the same as circuit 76 to apply a multiple of the input voltage as an output voltage to TEA laser 100.

Note that in both circuits 76 and 108 a common ground or reference point, i.e. node 96, is provided for TEA laser 100 and spark gap 94. In circumstances where the application of approximately one-half the full laser discharge voltage to TEA laser 100 prior to the selected firing of spark gap 94 is not a determinative limitation, circuits 76 and 108 are particularly useful. Further, in both circuits 78 and 108, spark gap 94 need withstand only one-half the circuit output voltage when spark gap 94 is open.

Of course, the various circuit elements and nodes described herein are given only as examples of electrical energy storage means, capacitor means, unidirectional current conducting means, electrical connecting means and terminating regions. Equivalents known to those skilled in the art can be substituted for the particular elements or nodes described herein.

I claim:

1. A voltage control circuit for impressing an output voltage upon a gas discharge device, wherein said circuit includes a reference point, comprising:

first energy storage means adapted to store electrical energy in response to a potential source of a first polarity relative to said reference point, thereby providing a voltage of a first magnitude, wherein said first energy storage means includes a first unidirectional current conducting means adapted to pass substantial current from a first terminating region to a second terminating region, and a first capacitor means electrically connected to and between said second terminating region and a third terminating region, wherein said third terminating region is directly electrically connected to said device;

second energy storage means adapted to store electrical energy in response to a potential source of a second polarity relative to said reference point, thereby providing a second voltage of a second magnitude, wherein said second energy storage means includes a second unidirectional current conducting means electrically connected to said first terminating region and adapted to pass substantial current from a fourth terminating region to said first terminating region, and a second capacitor means electrically connected to and between said fourth terminating region and a fifth terminating region, and wherein said fifth terminating region is directly electrically connected to said device; and means for electrically connecting said first and second energy storage means so that said output voltage is related to the sum of said first and second magnitudes, wherein said means for connecting said first and second energy storage means including a switching means electrically connected between said second and fourth terminating regions so that if said switching means is closed, said output voltage can be generated between said third and fifth terminating regions.

2. The circuit of claim 1 wherein the first and second unidirectional current conducting means are first and second diodes, respectively.

3. The circuit of claim 1 wherein said first and second capacitor means are first and second capacitors, respectively, of substantially the same capacitance.

4. The circuit of claim 1 wherein said switching means is a spark gap.

5. The circuit of claim 1 wherein said first and second capacitor means are first and second capacitors, respectively, of substantially the same capacitance, said third terminating region is electrically connected to said first capacitor by a first direct electrical connection of very low resistance, said fifth terminating region is electrically connected to said second capacitor by a second direct electrical connection of very low resistance, and when said switching means is closed a very low resistance path is provided between said first and second capacitors, so that, if said capacitors are fully charged, said output voltage is initially approximately twice the voltage across either of said first or second capacitors.

6. The circuit of claim 1 further including a first resistance means electrically connected to and between said third and fifth terminating regions.

7. The circuit of claim 6 further including a first input node, a second input node electrically connected to said third terminating region, and a second resistance means electrically connected to and between said first terminating region and said first input node, so that said first and second energy storage means can be charged by impressing a variable potential across said first and second input nodes.

8. A voltage control circuit, comprising:
first energy storage means adapted to store electrical energy in response to a potential source of a first polarity relative to a reference point in said circuit, thereby providing a first voltage of a first magnitude, wherein said first energy storage means includes a first unidirectional current conducting means adapted to pass substantial current from a first terminating region to a second terminating region, and a first capacitor means electrically connected to and between said second terminating region and a third terminating region;
second energy storage means adapted to store electrical energy in response to a potential source of a second polarity relative to said reference point, thereby providing a second voltage of a second magnitude, wherein said second energy storage means includes a second unidirectional current conducting means electrically connected to said first terminating region and being adapted to pass substantial current from a fourth terminating region to a said first terminating region, a second capacitor means electrically connected to and between said fourth terminating region and a fifth terminating region, and a third unidirectional current conducting means electrically connected to and between said third and fifth terminating regions and being adapted to pass substantial current in the same direction as said second unidirectional current conducting means; and
means for electrically connecting said first and second energy storage means so as to provide an output voltage related to the sum of said first and second magnitudes, wherein said means for connecting said first and second energy storage means includes a switching means electrically connected between said second and fourth terminating regions so that if said switching means is closed, said output voltage can be generated between said third and fifth terminating regions.

9. The circuit of claim 8 wherein said third unidirectional current conducting means is a third diode.

10. A voltage control circuit for impressing an output voltage upon a gas discharge device, wherein said circuit includes a reference point, comprising:
first energy storage means adapted to store electrical energy in response to a potential source of a first polarity relative to said reference point, thereby providing a first voltage of a first magnitude, wherein said first energy storage means comprises a first circuit branch including a first unidirectional current conducting means and a first capacitor means electrically connected in series with a first common node therebetween, and with said first capacitor means between said first common node and a first terminating region, and wherein said first terminating region is directly electrically connected to said device;
second energy storage means adapted to store electrical energy in response to a potential source of a second polarity relative to said reference point, thereby providing a second voltage of a second magnitude, wherein said second energy storage means comprises a second circuit branch including a second unidirectional current conducting means and a second capacitor means electrically connected in series with a second common node therebetween, with said second capacitor means between said second common node and a second terminating region, wherein said second terminating region is directly electrically connected to said device, and wherein said first and second circuit branches are electrically connected in parallel between third and fourth common nodes with said circuit branches being adapted to pass substantial current only in opposite directions; and
means for electrically connecting said first and second energy storage means so that said output voltage is related to the sum of said first and second magnitudes, wherein said means for connecting said first and second energy storage means comprises switching means coupled to and between said first and second common nodes, so that when said switching means is closed, said output voltage can be generated between said first and second terminating regions.

11. The circuit of claim 10 wherein said first and second unidirectional current conducting means are first and second diodes, respectively.

12. The circuit of claim 10 wherein first and second storage capacitor means are first and second capacitors, respectively, of substantially the same capacitance.

13. The circuit of claim 10 wherein said switching means is a spark gap.

14. The circuit of claim 10 wherein said first and second energy storage capacitor means are first and second capacitors, respectively, of substantially the same capacitance, said first terminating region is electrically connected to said first capacitor by a first direct electrical connection of very low resistance, said second terminating region is electrically connected to said second capacitor by a second direct electrical connection of very low resistance, and when said switching means is closed a very low resistance path is provided between said first and second capacitors, so that, if said capacitors are fully charged, said output voltage is approximately twice the voltage across either of said first or second capacitors.

15. The circuit of claim 10 further including a first resistance means electrically connected to and between said second terminating region and said fourth common node.

16. The circuit of claim 15 further including an input terminating region and a second resistance means coupled to and between said third common node and said input terminating region, so that said first and second energy storage capacitance means can be charged with electrical energy by impressing a variable potential across said input terminating region and said fourth common node.

17. A voltage control circuit, comprising: first energy storage means adapted to store electrical energy in response to a potential source of a first polarity relative to a reference point in said circuit, thereby providing a first voltage of a first magnitude, wherein said first energy storage means includes a first circuit branch including a first unidirectional current conducting means and a first capacitor means electrically connected in series with a first common node therebetween, and with said first capacitor means between said first common node and a first terminating region;

second energy storage means adapted to store electrical energy in response to a potential source of a second polarity relative to said reference point, thereby providing a second voltage of a second magnitude, wherein said second energy storage means includes a second circuit branch including a second unidirectional current conducting means and a second capacitor means electrically connected in series with a second common node therebetween, with said second capacitor means between said second common node and a second terminating region, wherein said first and second circuit branches are electrically connected in parallel between third and fourth common nodes with said circuit branches being adapted to pass substantial current only in opposite directions, and further including a third unidirectional current conducting means electrically connected to and between said second terminating region and said fourth common node and being adapted to pass substantial current in the same direction as said second unidirectional current conducting means; and means for electrically connecting said first and second energy storage means so as to provide an output voltage related to the sum of said first and second magnitudes, wherein said, means for connecting said first and second energy storage means comprises switching means coupled to and between said first and second common nodes, so that when said switching means is closed, said output voltage can be generated between said first and second terminating regions.

18. A voltage control circuit for impressing an output voltage upon a gas discharge device, wherein said circuit includes a reference point comprising:

first energy storage means adapted to store electrical energy in response to a potential source of a first polarity relative to said reference point, thereby providing a first voltage of a first magnitude, wherein said first energy storage means includes a first capacitor means electrically connected to and between a first terminating region and a second terminating region, and wherein said second terminating region is directly electrically connected to said device;

second energy storage means adapted to store electrical energy in response to a potential source of a second polarity relative to said reference point, thereby providing a second voltage of a second magnitude, wherein said second energy storage means includes a second capacitor means electrically connected to and between a third terminating region and a fourth terminating region, and wherein said fourth terminating region is directly electrically connected to said device; and means for electrically connecting said first and second energy storage means so that said output voltage is related to the sum of said first and second magnitudes, wherein said means for connecting said first and second energy storage means includes a switching means electrically connected to and between said first and third terminating regions so that if said switching means is closed, said output voltage can be generated between said second and fourth terminating regions.

19. The circuit of claim 18 wherein said first and second capacitor means are first and second capacitors, respectively, are substantially the same capacitance.

20. The circuit of claim 18 wherein said switching means is a spark gap.

21. The circuit of claim 18 wherein said first and second capacitor means are first and second capacitors, respectively, of substantially the same capacitance, said first terminating region is electrically connected to said first capacitor by a first direct electrical connection of very low resistance, said third terminating region is connected to said second capacitor by a second direct electrical connection of very low resistance, and when said switching means is closed a very low resistance path is provided between said first and second capacitors, so that, if said capacitors are fully charged, said output voltage is initially approximately twice the voltage across either of said first or second capacitors.

22. The circuit of claim 18 further including a first resistance means electrically connected to and between said second and fourth terminating regions.

23. The circuit of claim 22 further including first and second input nodes and second and third resistance means wherein said second resistance means is electrically connected to and between said first input node and said first terminating region and said third resistance means is electrically connected to and between said second input node and said third terminating region, so that said first capacitor means can be charged by applying a potential to said first input node which is positive relative to the potential applied to said second terminating region, and said second capacitor means can be charged by applying a potential to said second input node which is negative relative to the potential applied to said fourth terminating region.

24. A voltage control circuit for impressing an output voltage upon a gas discharge device, wherein said circuit includes a reference point, comprising:

first energy storage means adapted to store electrical energy in response to a potential source of a first polarity relative to said reference point, thereby providing a first voltage of a first magnitude, wherein said first energy storage means comprises a first unidirectional current conducting means electrically connected in series with a first capacitor means, with a first common terminating region therebetween, and wherein said first unidirectional current conducting means is adapted to pass substantail current in a first direction;

second energy storage means adapted to store electrical energy in response to a potential source of a second polarity relative to said reference point, thereby providing a second voltage of a second magnitude, wherein said second energy storage means comprises a second unidirectional current conducting means electrically connected in series with a second capacitor means, with a second common terminating region therebetween, wherein said second unidirectional current conducting means is adapted to pass substantial current in a second direction, and wherein said second common terminating region is electrically connected to said device, and wherein said first energy storage means and said second energy storage means are electrically connected in parallel by said first and second unidirectional current conducting means being electrically connected at a third common terminating region and said first and second capacitor means being electrically connected at a fourth common terminting region, with said fourth common terminating region being electrically connected to said device and said first and second directions being opposite directions in said parallel connection;

and means for electrically connecting said first and second energy storage means so that said output voltage is related to the sum of said first and second magnitudes, wherein said means for connecting said first and second energy storage means includes a switching means electrically connected to and between said first common terminating region and said fourth common terminating region, so that upon impressing a variable electrical potential between said third and fourth common terminating regions, said first and second capacitor means can be fully charged and if said switching means is closed, said output voltage can be generated between said second common terminating region and said switching means.

25. The circuit of claim 24 wherein said first and second unidirectional current conducting means are first and second diodes, respectively.

26. The circuit of claim 24 wherein said first and second capacitor means are first and second capacitors, respectively, of substantially the same capacitance.

27. The circuit of claim 24 wherein said switching means is a spark gap.

28. The circuit of claim 27 wherein said first and second capacitor means are first and second capacitors, respectively, of substantially the same capacitance, said first common terminating region is electrically connected to said first capacitor by a first direct electrical connection of very low resistance and is electrically connected to said spark gap by a second direct electrical connection of very low resistance, said first and second capacitors are each electrically connected by third and fourth direct electrical connections, respectively, of very low resistance to said fourth common terminating region, said second common terminating region is electrically connected to said second capacitor by a fifth direct electrical connection of very low resistance, and when said spark gap is closed, the resistance thereacross is very low, so that, if said capacitors are fully charged, said output voltage is approximately twice the voltage across either of said first or second capacitors.

29. A voltage control circuit for impressing an output voltage upon a gas discharge device, wherein said circuit includes a reference point, comprising:

first energy storage means adapted to store electrical energy in response to a potential source of a first polarity relative to said reference point, thereby providing a first voltage of a first magnitude, wherein said first energy storage means includes a first resistance means electrically connected to and between first and second nodes with said first node electrically connected to said potential source of a first polarity, and a first capacitor means electrically connected to and between said second node and a third node, with said third node directly electrically connected to said device;

second energy storage means adapted to store electrical energy in response to a potential source of a second polarity relative to said reference point, thereby providing a second voltage of a second magnitude, wherein said second energy storage means includes a second resistive means electrically connected to and between fourth and fifth nodes with said fourth node electrically connected to said potential source of a second polarity, and a second capacitor means electrically connected to and between said fifth node and sixth node, with said sixth node directly electrically connected to said device; and means for electrically connecting said first and second energy storage means so that said output voltage is related to the sum of said first and second magnitudes, wherein said means for connecting said first and second energy storage means includes a switching means electrically connected to and between said second and fifth nodes so that if said switching means is closed, said output voltage can be generated between said third and sixth nodes.

30. A voltage control circuit for impressing an output voltage upon a gas discharge device, wherein said circuit includes a reference point, comprising:

first energy storage means adapted to store electrical energy in response to a potential source of a first polarity relative to said reference point, thereby providing a first voltage of a first magnitude, wherein said first energy storage means comprises a unidirectional current conducting means electrically connected in series with a first capacitor means, with a first common terminating region therebetween, and wherein said first unidirectional current conducting means is adapted to pass substantial current in a first direction;

second energy storage means adapted to store electrical energy in response to a potential source of a second polarity relative to said reference point, thereby providing a second voltage of a second magnitude, wherein said second energy storage means comprises a second unidirectional current conducting means electrically connected in series with a second capacitor means, with a second common terminating region therebetween, wherein said second unidirectional current conducting means is adapted to pass substantial current in a second direction, wherein said second common terminating region is electrically connected to said device, and wherein said first and second energy storage means are electrically connected at a third common terminating region, and wherein said first energy storage means is electrically connected to a potential source of a first polarity, and said second energy storage means is electrically connected to a potential source of a second polarity;

and means for electrically connecting said first and second energy storage means so that said output voltage is related to the sum of said first and second magnitudes, wherein said means for connecting said first and second energy storage means includes a switching means having first and second terminals and being electrically connected to and between said first and third common terminating regions, so that if said switching means is closed, said output voltage can be generated between said second common terminating region and one terminal of said switching means.

31. A voltage control circuit for impressing an output voltage upon a gas discharge device, wherein said circuit includes a reference point, comprising:

first energy storage means adapted to store electrical energy in response to a potential source of a first polarity relative to said reference point, thereby providing a first voltage of a first magnitude, wherein said first energy storage means includes a first capacitor means electrically connected to and between a first terminating region and a second terminating region, and wherein said second terminating region is electrically connected to said device;

second energy storage means adapted to store electrical energy in response to a potential source of a second polarity relative to said reference point, thereby providing a second voltage of a second magnitude, wherein said second energy storage means includes a second capacitor means electrically connected to and between a third terminating region and a fourth terminating region, wherein said fourth terminating region is electrically connected to said device, and wherein at least one of said second or fourth terminating regions is directly electrically connected to said reference point; and means for electrically connecting said first and second energy storage means so that said output voltage is related to the sum of said first and second magnitudes, wherein said means for connecting said first and second energy storage means includes a switching means electrically connected to and between said first and third terminating regions so that if said switching means is closed, said output voltage can be generated between said second and fourth terminating regions.

32. A voltage control circuit for impressing an output votlage upon a gas discharge device, wherein said circuit includes a reference point, comprising:

first energy storage means adapted to store electrical energy in response to a potential source of a first polarity relative to said reference point, thereby providing a first voltage of a first magnitude, wherein said first energy storage means includes a first capacitor means electrically connected to said device;

second energy storage means adapted to store electrical energy in response to a potential source of a second polarity relative to said reference point, whereby providing a second voltage of a second magnitude, wherein said second energy storage means includes a second capacitor means electrically connected to and between a first node and a common node, wherein said common node is electrically connected to said first capacitor means; and means for electrically connecting said first and second energy storage means so that said output voltage is related to the sum of said first and second magnitudes, wherein said means for connecting said first and second energy storage means includes a switching means electrically connected to and between said first node and a second node, wherein said second node is electrically connected to said device and to said common node, and said second node is directly electrically connected to said reference point.

* * * * *

UNITED STATES PATENT AND TRADEMARK OFFICE
CERTIFICATE OF CORRECTION

PATENT NO. : 4,562,526

DATED : DECEMBER 31, 1985

INVENTOR(S) : ROBERT J. MATTHYS

It is certified that error appears in the above-identified patent and that said Letters Patent is hereby corrected as shown below:

In claim 1, column 6, lines 57 to 58, delete "including" and insert in lieu thereof --includes--.

In claim 32, column 14, line 24, delete "whereby" and insert in lieu thereof --thereby--.

Signed and Sealed this

Twenty-fifth Day of March 1986

[SEAL]

Attest:

DONALD J. QUIGG

Attesting Officer

Commissioner of Patents and Trademarks